United States Patent [19]

Agrawal et al.

[11] Patent Number: 5,228,040
[45] Date of Patent: Jul. 13, 1993

[54] TESTABLE IMPLEMENTATIONS OF FINITE STATE MACHINES AND METHODS FOR PRODUCING THEM

[75] Inventors: Vishwani D. Agrawal, New Providence; Kwang-Ting Cheng, Edison, both of N.J.

[73] Assignee: AT&T Bell Laboratories, Murray Hill, N.J.

[21] Appl. No.: 491,417

[22] Filed: Mar. 9, 1990

[51] Int. Cl.$^5$ .............................................. H04B 17/00
[52] U.S. Cl. ................... 371/22.1; 371/22.3; 371/22.5; 371/22.6
[58] Field of Search ............... 371/22.1, 22.3, 22.5, 371/22.6

[56] References Cited

U.S. PATENT DOCUMENTS

| | | | |
|---|---|---|---|
| 3,961,252 | 6/1976 | Eichelberger | 371/22.3 |
| 4,740,970 | 4/1988 | Burrows et al. | 371/15.1 |
| 4,792,954 | 12/1988 | Arps et al. | 371/48 |
| 4,929,889 | 5/1990 | Seiler et al. | 371/22.3 |
| 4,975,595 | 12/1990 | Roberts et al. | 307/272.2 |
| 4,991,176 | 2/1991 | Dahbura et al. | 371/27 |

OTHER PUBLICATIONS

A. J. de Geus, "Logic Synthesis Speeds ASIC Design", *IEEE Spectrum*, vol. 26, Aug. 1989, pp. 27-31.
F. C. Hennie, "Fault Detecting Experiments for Sequential Circuits", *Proc. 5th Annual Symp. on Switching Theory and Logical Design*, Princeton University, Nov., 1964, pp. 95-110.
Z. Kohavi and P. Lavallee, "Design of Sequential Machines with Fault-Detection Capabilities", *IEEE Trans. Electronic Computers*, vol. EC-16, Aug., 1967, pp. 473-484.
H. Fujiwara et al., "Easily Testable Sequential Machines with Extra Inputs", *IEEE Trans. Comput.*, vol. C-24, pp. 821-826, Aug. 1975.
V. D. Agrawal et al., "Automation in Design for Testability", *Proc. Custom Integrated Circuits Conf.*, Rochester, N.Y., pp. 159-162, May 1984.

*Primary Examiner*—Robert W. Beausoliel, Jr.
*Assistant Examiner*—Ly V. Hua
*Attorney, Agent, or Firm*—Gordon E. Nelson

[57] ABSTRACT

A testable implementation of a given finite state machine is produced by defining a test finite state machine which can set and read the same number of flip flops as are required for the memory elements of the given finite machine and then merging the test finite state machine with the given finite state machine to produce a testable finite state machine in which the test finite state machine and the given finite state machine share the flip flops. The testable implementation is then produced from the testable finite state machine. Since the test finite state machine and the given finite state machine share the flip flops of the testable implementation, the test finite state machine can be used to test the given finite state machine by setting and reading the given finite state machine's flip flops. Techniques are further disclosed for defining the test finite state machine and merging the test finite state machine with the given finite state machine.

21 Claims, 6 Drawing Sheets

SEQUENCES FOR FOUR-STATE TEST MACHINE

| INPUT SEQ | FINAL STATE | OUTPUT SEQ FOR INITIAL STATE | | | |
|---|---|---|---|---|---|
| | | T1 | T2 | T3 | T4 |
| p1p1 | T1 | q1q1 | q2q1 | q3q2 | q4q2 |
| p2p1 | T2 | q5q3 | q6q3 | q7q4 | q8q4 |
| p1p2 | T3 | q1q5 | q2q5 | q3q6 | q4q6 |
| p2p2 | T4 | q5q7 | q6q7 | q7q8 | q8q8 |

FIG. 9

TESTABLE SYNTHESIS OF SOME BENCHMARK FSMs

| CIRCUIT | NO OF FF | CIRCUIT SIZE (GRIDS/TRANSISTORS) | | OVER-HEAD | TESTS FOR M1 | | | TESTS FOR M1+M2 | | | | |
|---|---|---|---|---|---|---|---|---|---|---|---|---|
| | | M1 | M1+M2 | | FAULT COV | CPU SEC | TEST LEN | M2 TESTS | | M1+M2 TESTS | | |
| | | | | | | | | TEST LEN | FAULT COV | FAULT COV | CPU SEC | TEST LEN |
| A | 4 | 193/270 | 225/328 | 22% | 100.0% | 46 | 133 | 12 | 24.2% | 100% | 1.4 | 156 |
| B | 3 | 293/398 | 329/452 | 14% | 99.6% | 13 | 64 | 9 | 31.5% | 100% | 2.0 | 132 |
| C | 4 | 473/662 | 512/722 | 9% | 98.1% | 672 | 270 | 12 | 22.2% | 100% | 4.7 | 316 |
| D | 5 | 573/818 | 622/892 | 9% | 98.7% | 4570 | 276 | 15 | 25.4% | 100% | 9.9 | 445 |
| E | 5 | 895/1290 | 937/1356 | 5% | 98.1% | 1652 | 329 | 15 | 29.1% | 100% | 13.2 | 510 |
| F | 5 | 1062/1506 | 1195/1636 | 9% | 96.4% | 1848 | 316 | 15 | 10.2% | 100% | 23.3 | 735 |

TESTABLE IMPLEMENTATIONS OF FINITE STATE MACHINES AND METHODS FOR PRODUCING THEM

TECHNICAL FIELD

The invention is related to implementations of logic designs generally and more specifically to testable implementations of finite state machines.

BACKGROUND OF THE INVENTION

1. Field of the Invention

Many devices may be described as finite state machines, i.e., as a finite set of states together with rules for getting from one state to another. Typically, a transition from one state to another occurs in response to an input to the device and results in an output from the device. Implementations of finite state machines require memory elements for storing the current state of the finite state machine.

A problem in the design of implementations of finite state machines is testing. The behavior of a finite state machine depends not only on the inputs to the machine, but also on the current state of the machine, as determined by the contents of the memory elements. Consequently, a finite state machine is fully testable only if all of the memory elements can be set and read.

2. Description of the Prior Art

There are two ways of designing circuits for testability. In one method, the designer follows certain ad hoc rules of testability. Since these rules are based on experience, one can hope that the final product will be testable although no guarantee is given. In the second method, after the design is completed, the circuit structure is augmented for testability. This added hardware tunes the circuit for a guaranteed test generation by some given method. For example, in scan design, the added hardware guarantees the use of a combinational circuit test generator. In some cases, however, adding hardware to an already designed circuit is considered undesirable. This may be particularly true when the design has undergone optimization.

The current state of the art in synthesis for logic and timing optimization appears to be more advanced than that in synthesis for testability as described in A. J. de Geus, "Logic Synthesis Speeds ASIC Design", *IEEE Spectrum*, Vol. 26, pp. 27-31, August 1989, Testing of finite state machines (FSM) was addressed by Hennie as described in F. C. Hennie, "Fault Detecting Experiments for Sequential Circuits", *Proc. 5th Annual Symp. on Switching Theory and Logical Design*, Princeton University, pp. 95-110, November 1964 who devised checking experiments. In a checking experiment, an input sequence is applied to the machine such that the output uniquely distinguishes the machine from all other machines having the same number of inputs and outputs, and the same or fewer states. Hennie's procedure of constructing an input sequence for checking experiment is only practical when a distinguishing sequence exists. For an n-state machine, its distinguishing sequence (DS) will produce n different outputs depending upon the initial state. Kohavi and Lavallee identified the existence of a distinguishing sequence of bounded length as the requirement for diagnosability as described in Z. Kohavi and P. Lavallee, "Design of Sequential Machines with Fault-Detection Capabilities" *IEEE Trans. Electronic Computers*, Vol. EC-16, pp. 473-484, August 1967, Their design for testability added an extra output to make the DS shorter. As described in H. Fujiwara et al, "Easily Testable Sequential Machines with Extra Inputs", *IEEE Trans. Comput.*, Vol. C-24, pp. 821-826, August 1975, Fujiwara et al further defined an easily testable n-state machine as one having synchronizing and transfer sequences of length $\log_2 n$. A synchronizing sequence is defined as an input sequence whose application is guaranteed to leave the FSM in a certain final state regardless of its initial state. A transfer sequence is an input sequence that changes the state from a given initial state to a given final state.

For most practical FSMs, the procedures just mentioned tend to produce long sequences. Though useful in simulation-based design verification, such tests are not commonly used in production testing. The testing problem, thus, relates to finding a set of tests for modeled (usually, stuck type) faults. A commonly used design for testability is the scan method that converts the FSM testing problem to that of combinational logic testing, as described in V. D. Agrawal et al, "Automation in Design for Testability", *Proc. custom Integrated Circuits Conf.*, Rochester, N.Y., pp. 159-163, May 1984.

In the scan method, as well as in many other methods, the circuit is modified after the design is completed. With tool-based synthesis, the advantage of logic optimization may be lost in such post-design modification.

An object of the present invention is to overcome the just-described problems by providing a new method of synthesis of devices describable as finitestate machines which adds the test function before synthesis and by providing devices produced by the new method.

SUMMARY OF THE INVENTION

The invention to which this patent application is directed is a testable implementation of a given finite state machine which has m memory elements, $m \geq 1$. The testable implementation comprises a first implementation of the given finite state machine and a second implementation of a test finite state machine. The test finite state machine also has m memory elements and is capable of setting and reading the m memory elements. The first and second implementations are merged in the testable implementation. The first implementation includes an implementation of the m memory elements; the merged second implementation sets and reads the implementation of the m memory elements. The test finite state machine implemented in the testable implementation may thus be used to set and read the m memory elements in the given finite state machine implemented in the testable implementation and thereby to test the given finite state machine implemented in the testable implementation.

The foregoing and other objects and advantages of the invention will be understood by those of ordinary skill in the art upon consideration of the following Detailed Description and Drawing.

BRIEF DESCRIPTION OF THE DRAWING

FIG. 9 is a table comparing testable and non-testable implementations of certain finite-state machines.

Figure 1:
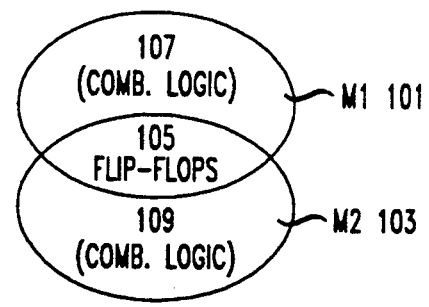
FIG. 1 is a high-level diagram of a testable implementation of a finite state machine.

The reference numbers in the Drawings and the Detailed Description have two parts: the leftmost digit is the number of the drawing in which the item specified by the reference number first appears; the remaining two digits specify the item in the drawing indicated by the leftmost digit.

DETAILED DESCRIPTION

FIG. 1 shows a high-level view of our proposed architecture. It is recognized that the FSM M1 101, which is to be synthesized, may not be testable. We will call M1 101 the object machine. Testability, in the present context, refers to the ability to generate tests. The machine is realized with memory elements 105 and combinational logic 107. For the given object machine, we specify a test machine, M2 103. Test machine 103 has the same number of memory elements 105 as the object machine. The physical memory elements, shown as flip-flops 105 in FIG. 1, are shared between the two machines. In an actual implementation of this concept, the logic, inputs and outputs of these machines may also be either partially or fully shared. Test machine 103 performs only two functions: (1) it can be set to all of its states by short predetermined sequences, and (2) its state can be observed at the output by applying a short input sequence. As discussed in the next section, these test functions can easily be specified through a state diagram.

The first step in synthesis is to merge the state diagrams of M1 101 and M2 103. This is done so that a minimum number of transitions are added to M1. If M1 is fully or almost fully specified, such a merging may not be possible. In that case a test input can be added to the machine. Adding one input doubles the number of possible edges. The combined state diagram is then used for state assignment, logic minimization, etc., to implement the function.

The implemented FSM is now capable of performing both object and test functions. For testing, first the test function is executed to verify that all (flip-flops) 105 can be set and observed. The execution of this function will detect most faults in flip-flops 105 and some faults in the combinational logic that are common to both machines. For the remaining faults, we use a combinational circuit test generator to determine the required inputs and states. Also, a fault may be detected either at a primary output or at a state variable. These combinational tests are applied to the machine in much the same way as in a scan circuit. In place of scan-in and scan-out, the predetermined sequences of M2 103 are used.

As may be noticed, scan is a special case of our architecture where M2 103 is a shift register and the test mode input is the extra input added for merging the two state diagrams. Such presynthesis implementation of the test logic will allow the use of the functional logic for the test function where possible. In general, for a given object function, a shift register may not be the best choice.

A DESIGN FOR THE TEST MACHINE

Suppose object machine 101 has n states. Then test machine 103 must use $m = \lceil \log_2 n \rceil$ state variables. We, therefore, specify the function of test machine 103 with $N = 2^m$ states; denoted as T1, T2, ..., TN. We require that, starting in any arbitrary state, machine 103 be brought to any given state by an input sequence of length $\log_k N$, where k is a design parameter. Also, such an input sequence should produce an unique output sequence depending only upon the initial state. It may be necessary to select k such that $\log_k N$ is an integer. We select k distinctly different inputs, p1, p2, ..., pk, and divide the N states of test machine 103 into k equal groups, G1, G2, ..., Gk. The state transitions are specified as follows: (1) Each state has k outgoing edges labeled p1, p2, etc., such that the edge labeled pi terminates on a state belonging to the group Gi. Between any pair of states, only one edge is permitted in either direction. Thus, there can be at most two edges provided they are in opposite directions. Self-loops are permitted in the state diagram. (2) Each state has exactly k incident edges. Clearly, all edges incident on state Tj will be labeled pi if Tj belongs to group Gi. These conditions, while necessary, may not be sufficient. The following procedure, however, will always result in a complete specification of the test machine.

A Method for Specifying State Transitions of Test Machine

Figure 2:
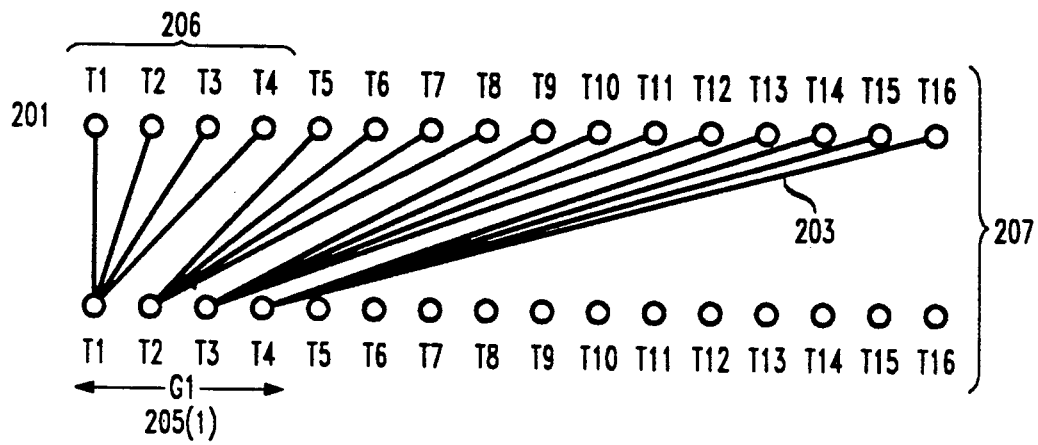
FIG. 2 is a diagram showing state transitions in a test finite state machine.
Figure 2:
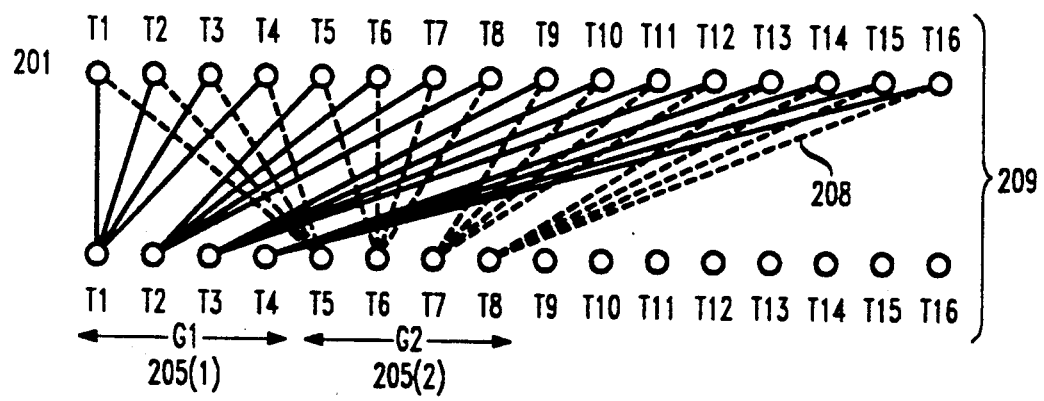
Figure 2:
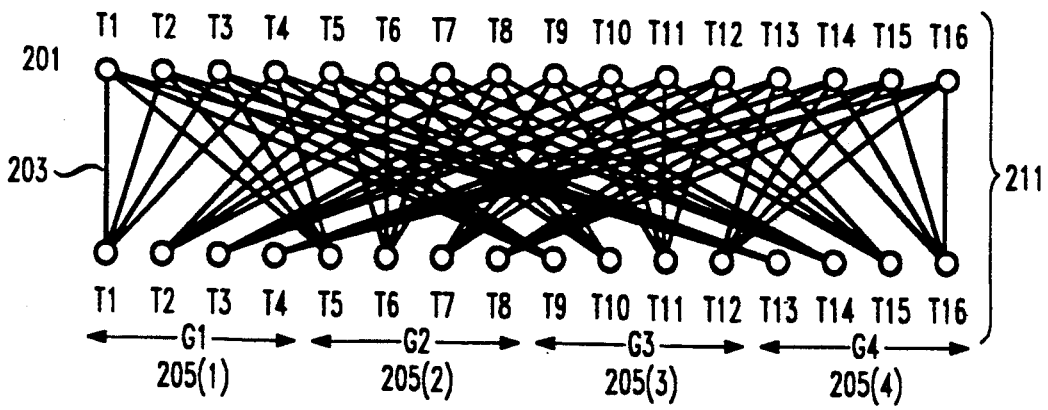

We will illustrate the procedure with an example of 16 states 201, T1 through T16. Four inputs (k=4), p1, p2, p3, and p4, are used. As shown in FIG. 2, states 201 are arranged in two rows. Each row contains all states. The top row indicates the present state and the bottom row contains the next states. A transition 203 is represented by a directed edge from a state in the top row to some state in the bottom row. The edge label (not shown in FIG. 2 for clarity) shows the input and output. This diagram contains the same information as a conventional state diagram. In our case, however, any number of transitions can be represented by stacking up copies of the diagram.

Diagram 207 shows all edges with label p1. We draw edges from the first k states 206 in the top row to the first state in the bottom row. Next, the states numbered from k+1 to 2k are connected to the second state in the bottom row. By the time this process is carried out for all states in the top row, all transitions to the first k states of the bottom row have been specified. These k states form the group G1 205 (1) that is the target group for the input p1.

A similar procedure is carried out for the transitions of p2 and other inputs. The target states for p2 are the states numbered k+1 to 2k in the bottom row. These form the group G2 205 (2). In diagram 209, p2 transitions 208 are shown by dashed lines to distinguish from the p1 transitions. By the time this procedure is completed for all inputs up to pk, all target groups have been covered and the state diagram is complete. The result for the 16-state example with k=4 is shown in diagram 211. Arrows and edge labels in this diagram have been suppressed for clarity.

With state diagram 211 specified above, an input sequence of length $\log_k N$ will take the machine to a specific state. For k inputs used in the state diagram, there are N such sequences, each carrying the machine to one distinct state.

We can now specify the outputs for the test machine. Each of the k edges incident on a state must have different output labels. Suppose, we select k distinctly different output patterns and assign them to the edges of the test machine, such that (1) all edges originating at a state have identical output labels, and (2) all edges incident on the same state have different output labels. It can be verified that if the machine is in some initial state and any input sequence of length $\log_k N$ is applied, then there are N possible output sequences, each associated with a different initial state. Thus, the observed output sequence will uniquely identify the initial state. In general, however, more than k output patterns can be used as long as they satisfy certain constrains. We give an example below.

The value of k can be anywhere between 2 and N. However, the maximum value is bounded by the total number of possible input vectors. A larger value of k will require shorter sequences for setting and observing states. On the other hand, it will require a larger number of edges to be specified in the state diagram of the machine. With the addition of these edges to the object machine, the resulting design may need more hardware. Thus, a smaller value of k should be preferred. In the following example, we use k=2.

Figure 3:
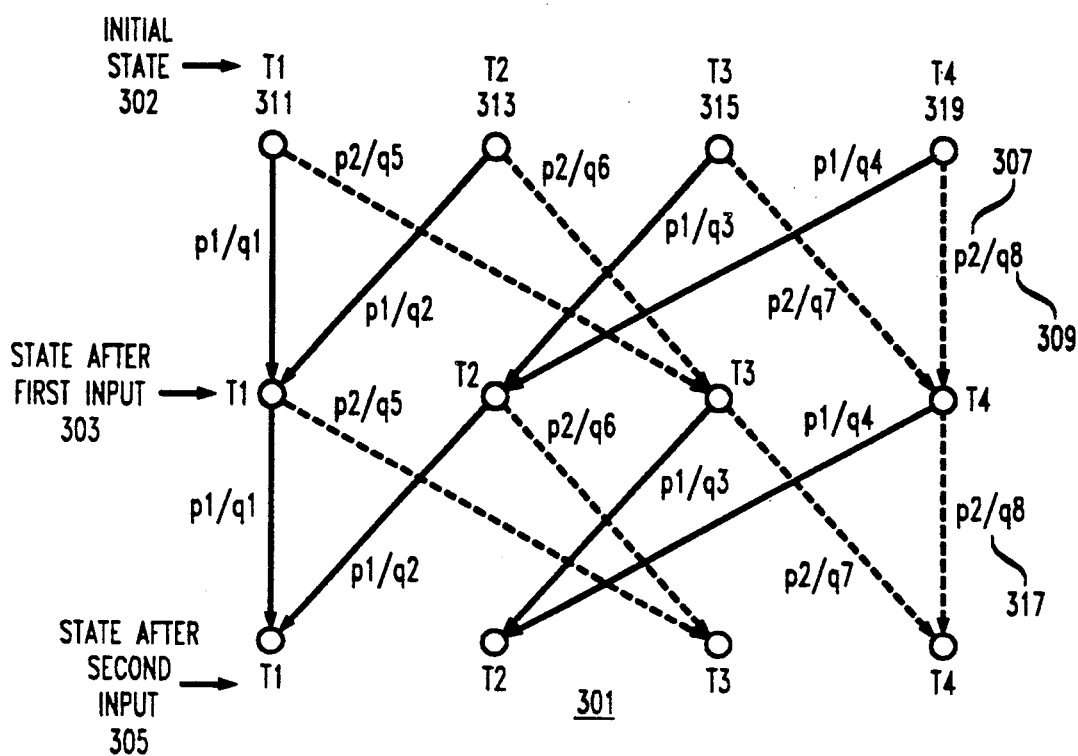
FIG. 3 is a diagram showing state transition sequences in a four-state test finite state machine.

FIG. 3 shows an example of a four-state test machine 301. Since we have chosen k=2, a series of two transitions will illustrate the complete operation. States T1 311 and T2 313 form the group G1. T3 315 and T4 319 belong to group G2 205(2). The two input patterns are p1 and p2. Suppose we use outputs q1 through q8 that satisfy the following constraints:

$q1 \neq q2$
$q3 \neq q4$
$q5 \neq q6$
$q7 \neq q8$

It can be verified from FIG. 3 that no two initial states will produce the same output sequence when a sequence of two input patterns is applied. For example, if we apply the sequence p2p2 to reach the state T4, an initial state T1 will cause q5q7 output while the initial state T2 will cause the output to be q6q7. Since $q6 \neq q6$, these two output sequences will be different. Notice that all four of the above constraints can be simultaneously satisfied by choosing q1=q3=q5=q7, q2=q4=q6=q8 and $q1 \neq q2$. However, the greater flexibility allowed by eight patterns is desirable when the test machine is superimposed on the object machine.

Figure 4:
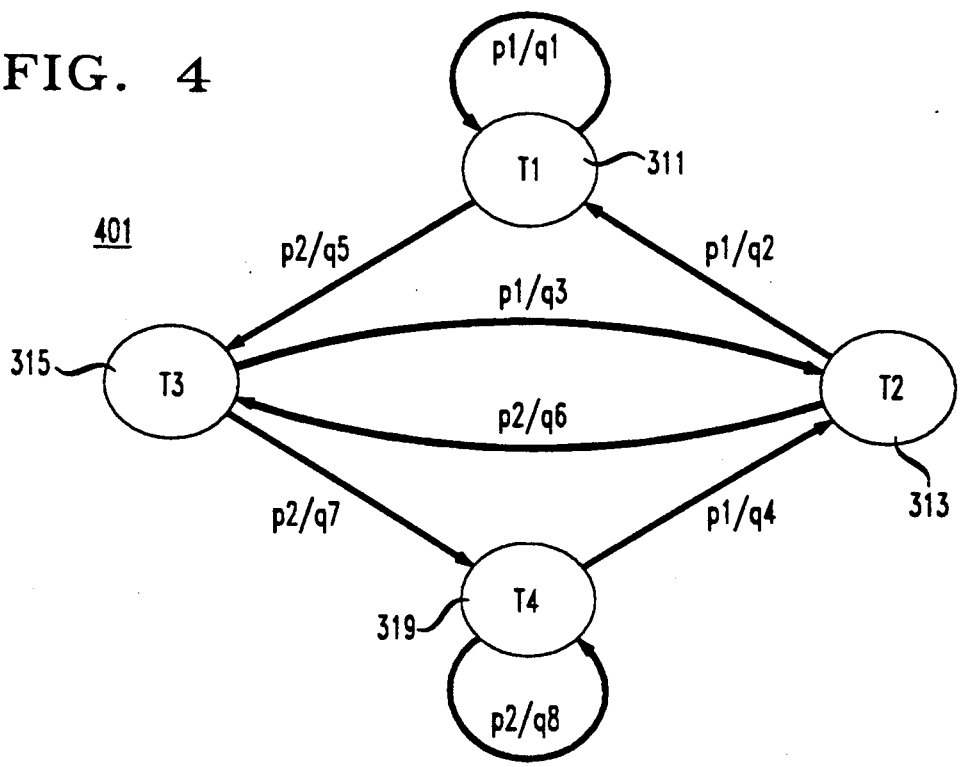
FIG. 4 is a standard state transition diagram for the four-state test finite state machine.
Figures 4A, 5:
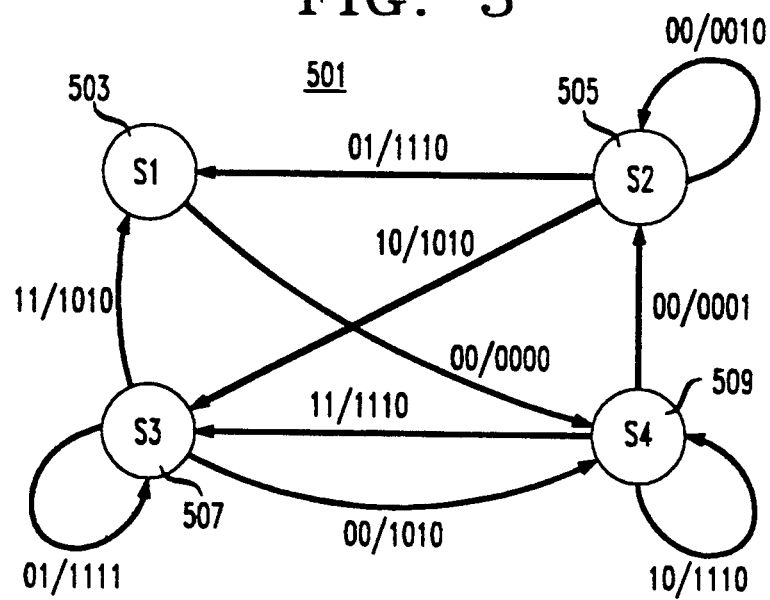
FIG. 4A is a table of input and output sequences for the four-state test finite state machine.
FIG. 5 is a standard state transition diagram for a four-state object finite state machine.

The operation of this machine is given in FIG. 4A. The state T1 311 has the synchronizing sequence p1p1. An application of this input sequence sets the machine in the state T1 311 irrespective of the initial state. All four synchronizing sequences are also distinguishing sequences as the output response uniquely identifies the initial state. This is because of the output constraints (1) through (4).

The state diagram of the four-state test machine is given in FIG. 4. All states, inputs and outputs are shown symbolically. Their specific binary codes are only determined after this machine has been merged with the object machine. Interestingly, for specific encoding only, this machine can be implemented as a shift register. For other encodings, it may produce different structures.

AN EXAMPLE

We will illustrate the method using the four-state object machine shown in the standard state diagram of FIG. 5. Object machine 501 has four states: S1 503, S2 505, S3 507, and S4 509. The transitions 203 between the states are indicated by the arrows and the edge labels 317 indicate the input causing the transition and the output resulting from the transition. Thus, when machine 501 is in state 509 and receives an input of 00, it makes the transition to state 505 and outputs 0001.

Figure 6:
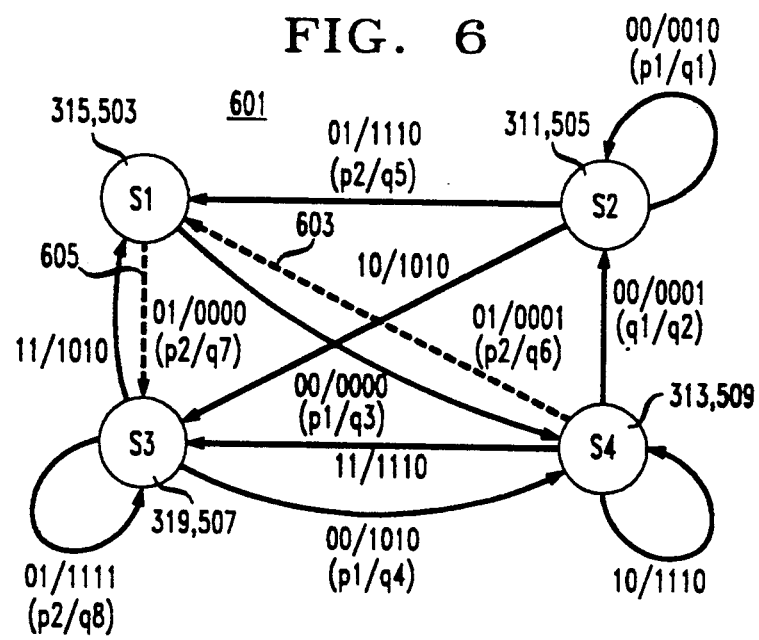
FIG. 6 is a standard state transition diagram for a testable finite state machine produced by merging the test finite state machine and the object finite state machine.

To produce a testable version of object machine 501, we merge object machine 501 with test machine 401 to produce a testable finite state machine. The merger is done in such a fashion that a minimum number of edges are added to object machine 501. The result of the merger is shown in FIG. 6. In that figure, states and edges shared by both the test machine and the object machine are labelled with bold-face labels. The sharing is achieved in testable finite state machine 601 as follows: state T1 311 has been assigned to state S2 505, T2 313 to S4 509, T3 315 to S1 503, and T4 319 to S3 507. Further, the input p1 of machine 401 has been set to input 00 of machine 601, the input p2 to 01, and so forth, while q1 has been set to 0010, q2 to 0001, and so forth. With these assignments and settings, only the two edges 603 and 605 need to be added to object machine 501 to produce testable finite state machine 601. In the example, the merger did not result in edges where the same edge has conflicting labels. If that situation cannot be avoided, an extra input line must be added.

Figure 7:
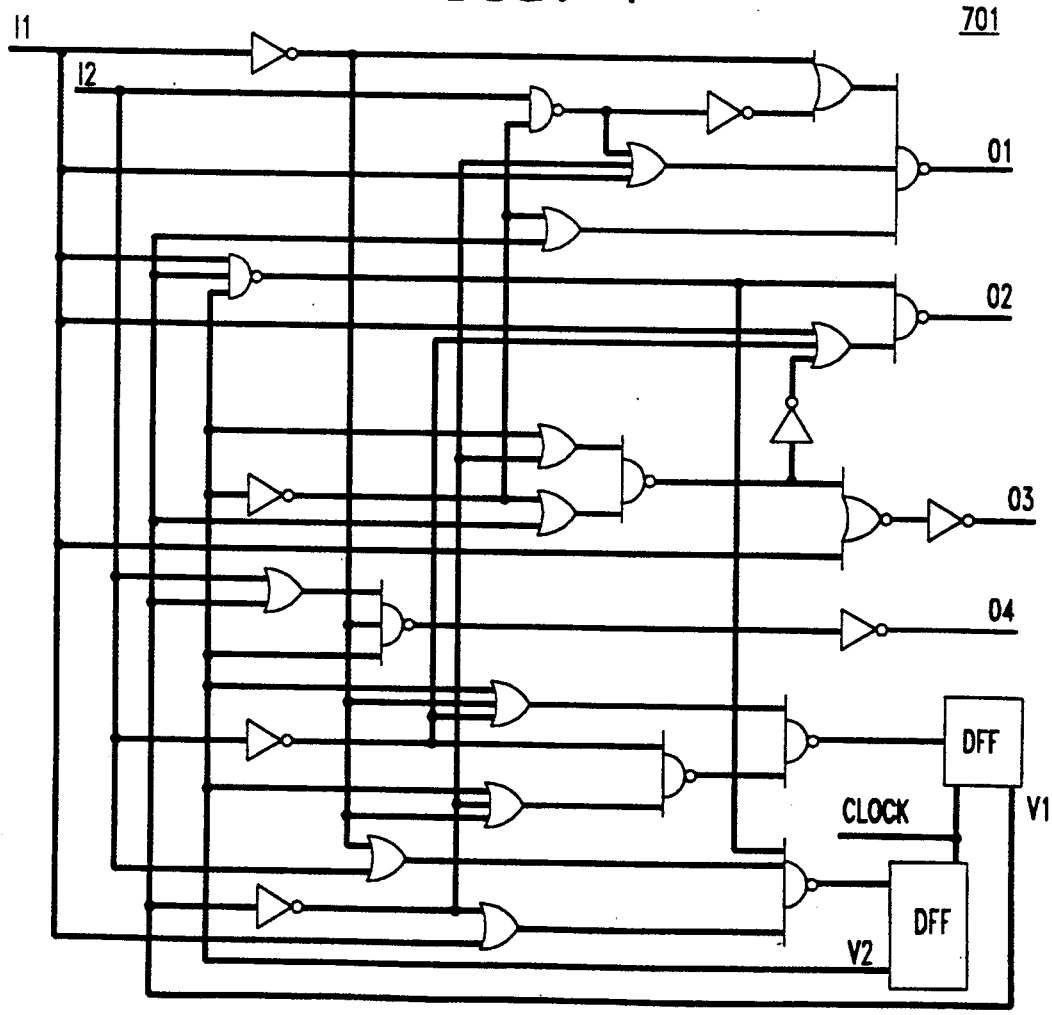
FIG. 7 is a logic diagram of an implementation of the testable finite state machine of FIG. 6.

Merged machine 601 was synthesized using a state assignment program, MUSTANG, as described in S. Devadas et al, "MUSTANG: State Assignment of Finite State Machines Targeting Multi-Level Logic Implementations," *IEEE Trans.* CAD, Vol. CAD-7, pp. 1290–1300, December 1988, the logic minimization programs, ESPRESSO and MIS, as described in R.K. Brayton et al, *Logic Minimization Algorithms for VLSI Synthesis*, Kluwer Academic Publishers, Boston, Mass., 1984, and R.K. Brayton et al, "MIS: A Multiple Level Logic Optimization System" *IEEE Trans.* CAD, Vol. CAD-6, pp. 1062–1081, November 1987, and a standard cell library mapping program, DAGON as described in K. Keutzer, "DAGON: Technology Binding and Local Optimization by DAG Matching" *Proc. 24th Design Automation Conf.*, pp. 341-347, June 1987. The state assignment used was S1=00, S2=10, S3=01 and S4=11. Synthesized circuit 701 is shown in FIG. 7. It uses 29 gates and two flip-flops. The standard cell design was sized at 93 grids. A grid is a measure of the size of the circuit when implemented as a silicon integrated circuit.

Operation of the machine synthesized from finite state machine 601 was tested by an input sequence, 00, 01, 01, 00, 01, 01. This sequence sets each flip-flop to 0 and 1, and observes their states at the primary outputs. The gate-level coverage of single stuck faults by this sequence was 55%. The combinational part of the circuit was isolated and tests for the remaining faults were generated by a combinational circuit test generator. The test generator produced 9 vectors specifying inputs I1, I2 and state variables V1, V2. Each test was preceded by two input vectors to set the state. These two vectors also distinguished the states of the previous test to the output. Thus, a set of 35 vectors detected all faults.

Figure 8:
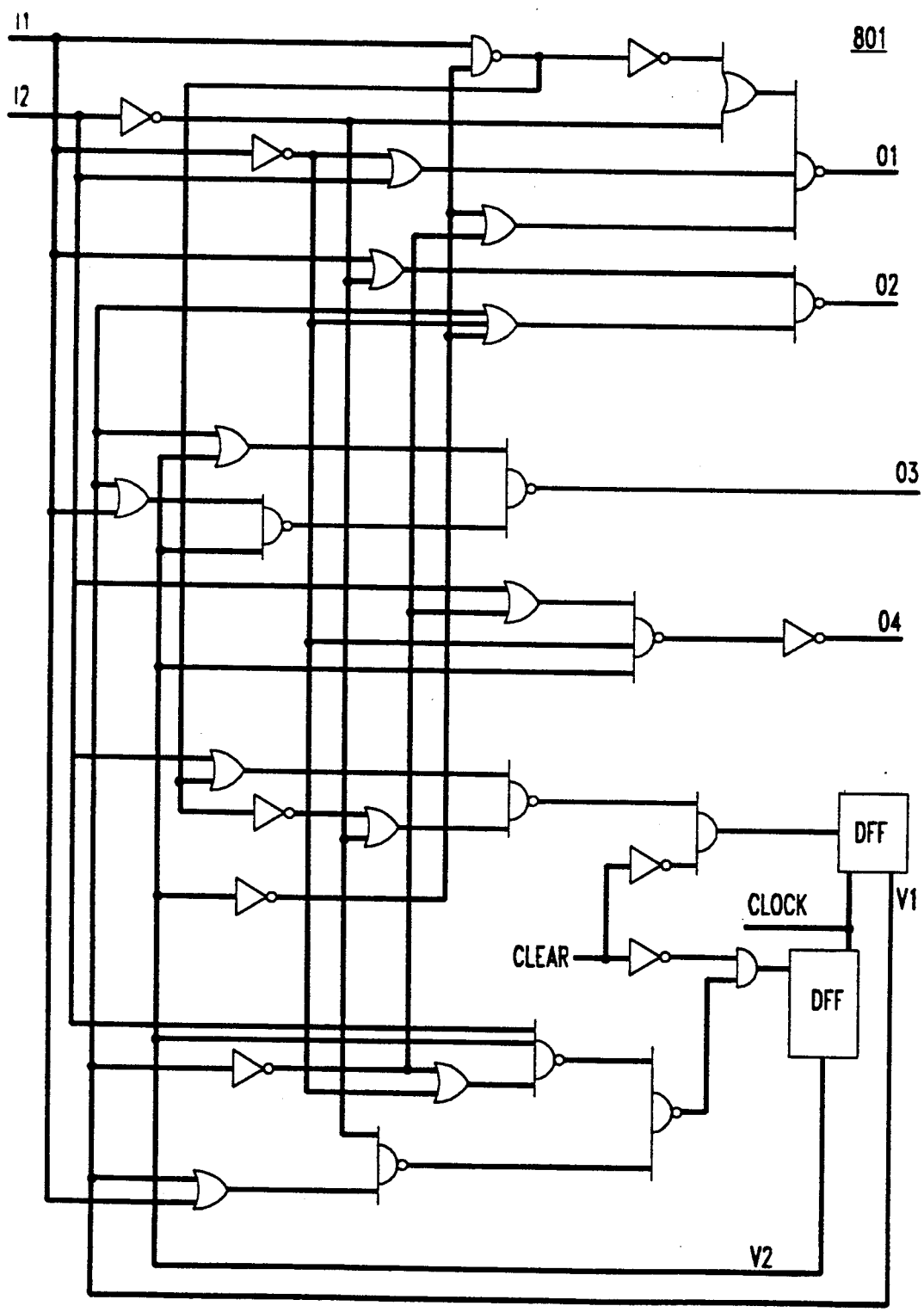
FIG. 8 is a logic diagram of an implementation of the object finite state machine of FIG. 5.

For comparison, object machine 501 was also synthesized. The result is shown in FIG. 8. Circuit 801 contains 33 gates and two flip-flops. An additional CLEAR input and four gates for synchronous initialization are included. The standard cell design occupied 97 grids. Now, the tests must be generated either manually or by a sequential circuit test generator. Both methods require excessive effort. A conversion to scan design, on the other hand, takes at least 10 extra grids and additional inputs and outputs although the CLEAR signal and the four associated gates can be eliminated. The test generation is then similar to the testable design just described.

FSM BENCHMARK EXAMPLES

In FIG. 9, we summarize the design of six FSMs. The synthesis procedure was similar to that described in the previous section. In all cases, one input signal was added to make the test function embedding possible. Testability overhead, computed from the transistor count, ranges from 5% to 22%. On an average, we observe lower overheads for larger circuits.

The observed lower overhead is not surprising since in the case of large circuits the synthesis may be able to reuse parts of the object function logic for the test function. In both cases, that is for M1 101 implemented alone and for M1 101 +M2 103, the tests were generated on a SUN4/260 workstation using sequential circuit test generator. Tests for M1 101 +M2 103 consist of two parts. In the first part, to test the operation of M2 103, each flip-flop is successively set to 1 and 0 and its states are observed. These vectors are directly obtained from the test machine transitions in state diagram. The vectors are then run through a fault simulation of the entire circuit. For example, the 12 vectors for testing flip-flops of A covered 24.2% faults in the entire circuit. For the remaining faults, combinational tests were generated in 1.4 seconds on a SUN4/260. When these tests were converted into sequences and the 12 M2 103 vectors were added, the total vector count for this circuit became 156. Most circuits, in M1 101 +M2 103 implementation, required one or two orders of magnitude less time for test generation as is typical of combinational circuits.

Another trend is clear from FIG. 9. The achieved fault coverage for M1 101 starts dropping as the circuits become larger. This is typical of sequential circuits. Similar to scan design, M1 101 +M2 103 require more test vectors.

In some cases, for example for the F circuit, the M1 101 +M2 103 design turned out to be a scan register. For the type of test machine used in these examples, the final design should not normally require more hardware than what a scan register would need. This is because a good synthesis system should implement the F machine as a scan register whenever that happens to be the most efficient implementation. In one example (i.e., A circuit), however, we found the overhead (22%) to be higher than scan. This may be due to the specific heuristics used in state assignment and in logic minimization.

CONCLUSION

In general, the specification of a typical finite state machine may contain unspecified (don't care) transitions and inputs. Such incompleteness adds flexibility commonly used for optimization in synthesis. Our method of designing testable machines also makes use of this flexibility. Of course, the final size will depend on how well the synthesis algorithms perform. However, the design should not be worse than the one in which testability hardware is added after synthesis. Our method which, like scan, also relies on a combinational circuit test generator, is a generalization of scan. The actual design of the test machine may or may not be a scan register depending upon the object machine specification. In some cases, as shown by our example, extra inputs and outputs may not be necessary.

In the foregoing Detailed Description, we have shown how to make and use testable implementations of finite state machines. The concepts presented in the present patent application are quite general and may be used with many different circuit synthesis and test technologies. For that reason, the Detailed Description is to be understood as being in all respects illustrative and exemplary, but not restrictive, and the scope of the invention disclosed herein is to be determined solely from the claims as interpreted in light of the doctrine of equivalents.

What is claimed is:

1. Apparatus which implements a given finite state machine, the given finite state machine requiring a set of m memory elements, $m \geq 1$, and the apparatus comprising:
   first means for implementing the given finite state machine, the first means including the set of m memory elements; and
   second means for implementing a test finite state machine, the second means being able to set and/or read the memory elements in the set of m memory elements, the first means and the second means being produced from a merged finite state machine which is obtained by merging the given finite state machine with the test finite state machine, whereby operation of the apparatus may be tested by employing the second means to set and/or read memory elements in the set of m memory elements.

2. The apparatus set forth in claim 1 wherein:
   the test finite state machine has one or more states and can be set to each of the states and each of the states of the test finite state machine can be observed at an output by applying one of a plurality of predetermined input sequences.

3. The apparatus set forth in claim 2 wherein:
   the test finite state machine has $N=2^m$ states, each state may be reached in response to one of the predetermined input sequences, and reaching the state produces an output sequence which is unique for the state.

4. The apparatus set forth in claim 3 wherein:
   none of the predetermined input sequences has a length greater than $\log_k N$, where k is a design parameter such that $2 \leq k \leq N$.

5. The apparatus set forth in claim 4 wherein:
   k is chosen from the lower portion of the range $2 \leq k \leq N$.

6. The apparatus set forth in claim 4 wherein:

the test finite state machine has k distinctly different inputs p1, p2, ... pk and k distinctly different outputs q1, q2, ... qk where $\log_k N$ is an integer;

the N states are divided into k equal groups G1, G2, ... Gk;

each state has k outgoing edges, one of the outgoing edges in each state going to one of the states in each of the groups G1, G2, ... Gk, and k incoming edges, one of the incoming edges in each state coming from one of the states in each of the groups G1, G2, ... Gk; and each edge represents a state transition which has a distinctly different combination of an input pi and an output qj.

7. The apparatus set forth in claim 1 wherein:
the first means includes a component other than the set of m memory elements; and
the second means also includes the other component.

8. The apparatus set forth in claim 7 wherein:
the other component is an input or an output.

9. The apparatus which implements the given finite state machine set forth in claim 1, 7, 8, 2, 3, 4, 5, or 6, wherein the second implementation is merged with the first implementation by performing the steps of:

producing a first state graph specifying first state transitions for the given finite state machine;

producing a second state graph specifying second state transitions for the test finite state machine;

producing a third state graph by adding new transitions to the first state graph such that all of the first state transitions and all of the second state transitions are present in the third state graph; and producing the apparatus from the third state graph.

10. The apparatus set forth in claim 9 wherein: the step of producing the third state graph includes the step of determining a minimal number of the new transitions and adding only the minimal number of the new transitions to the first state graph.

11. A method for producing apparatus which implements a given finite state machine which requires a first set of m memory elements, $m \geq 1$, the method comprising the steps of:

defining a test finite state machine, the test finite state machine requiring a second set of m memory elements and being capable of setting and/or reading the m memory elements in the second set;

defining a testable finite state machine by merging the test finite state machine and the given finite state machine such that the testable finite state machine has a third set of m memory elements which serves as both the first set and the second set; and producing the apparatus from the definition of the testable finite state machine, the apparatus including an implementation of the third set, whereby the test finite state machine implemented in the testable implementation may be employed to set and/or read the m memory elements in the implementation of the third set and thereby to test the given finite state machine implemented in the apparatus.

12. The method for producing the apparatus which implements the given finite state machine set forth in claim 11 wherein:

the given finite state machine further requires a first set of further components;

the step of defining a test finite state machine defines the test finite state machine to require a second set of further components;

the step of defining a testable finite state machine merges the test finite state machine and the given finite state machine such that a third set of further components serves as both the first set of further components and the second set thereof; and the step of producing the apparatus produces the apparatus such that the apparatus includes an implementation of the third set of further components.

13. The method for producing apparatus which implements the given finite state machine set forth in claim 12 wherein:

the step of producing the apparatus produces the apparatus such that the implementation of the third set of further components includes inputs and/or outputs.

14. The method for producing apparatus which implements the given finite state machine set forth in claim 11 wherein:

the test finite state machine is defined such that the test finite state machine has one or more states and can be set to each of the states and each of the states of the test finite state machine can be observed at an output by applying one of a plurality of predetermined input sequences.

15. The method of producing apparatus which implements the given finite state machine set forth in claim 14 wherein:

the test finite machine is further defined such that the test finite state machine has $N = 2^m$ states, each state may be reached in response to one of the predetermined input sequences, and reaching the state produces an output sequence which is unique for the state.

16. The method for producing apparatus which implements the given finite state machine set forth in claim 15 wherein:

the test finite state machine is further defined such that none of the predetermined input sequences has a length greater than $\log_k N$, where k is a design parameter such that $2 \leq k \leq N$.

17. The method for producing apparatus which implements the given finite state machine set forth in claim 16 wherein:

the test finite state machine is further defined such that k is chosen from the lower porion of the range $2 \leq k \leq N$.

18. The method for producing apparatus which implements the given finite state machine set forth in claim 15 wherein:

the test finite state machine is further defined such that the test finite state machine has k distinctly different input p1, p2, ... pk and k distinctly different output q1, q2, ... qk where $\log_k N$ is an integer;

the N states are divided into k equal groups G1, G2, ... Gk;

each state has k outgoing edges, one of the outgoing edges in each state going to one of the states in each of the groups G1, G2, ... Gk, and k incoming edges, one of the incoming edges in each state coming from one of the states in each of the groups G1, G2, ... Gk; and each edge represents a state transition which has a distinctly different combination of an input pi and an output qj.

19. The method for producing apparatus which implements the given finite state machine set forth in claim 11, 12, 13, 14, 15, 16, 17, or 18, wherein the step of defining the testable finite state machine include the steps of:

produce a first state graph specifying first state transitions for the given finite state machine;

producing a second state graph specifying second state transitions for the test finite state machine; and producing a third state graph for the testable finite state machine by adding new transitions to the first state graph such that all of the first state transitions and all of the second state transitions are present in the third state graph.

20. The method of claim 19 wherein: the step of producing the third state graph includes the step of determining a minimal number of the new transitions and adding only the minimal number of the new transitions to the first state graph.

21. Apparatus which implements a given finite state machine which requires a set of m memory elements, $m \geq 1$, the apparatus being produced by performing steps comprising:

defining a test finite state machine, the test finite state machine requiring a second set of m memory elements and being capable of setting and/or reading the m memory elements in the second set;

defining a testable finite state machine by merging the test finite state machine and the given finite state machine such that the testable finite state machine has a third set of m memory elements which serves as both the first set and the second set; and producing the apparatus from the definition of the testable finite state machine, the apparatus including an implementation of the third set, whereby the test finite state machine implemented in the testable implementation may be employed to set and/or read the m memory elements in the implementation of the third set and thereby to test the given finite state machine implemented in the apparatus.

* * * * *

UNITED STATES PATENT AND TRADEMARK OFFICE
CERTIFICATE OF CORRECTION

PATENT NO. : 5,228,040
DATED : July 13, 1993
INVENTOR(S) : V. D. Agrawal and K-T. Cheng It is certified that error appears in the above-identified patent and that said Letters Patent is hereby corrected as shown below:

In Claim 18, Column 10, line 18, "different input" should read
--different inputs--

In Claim 19, Column 11, line 1, "include the" should read
--includes the--

Signed and Sealed this

First Day of March, 1994

Attest:

BRUCE LEHMAN

Attesting Officer          Commissioner of Patents and Trademarks